United States Patent
Ogomi et al.

(10) Patent No.: US 10,353,021 B2
(45) Date of Patent: Jul. 16, 2019

(54) MAGNETIC SENSOR DEVICE

(71) Applicant: Mitsubishi Electric Corporation, Chiyoda-ku (JP)

(72) Inventors: Tomokazu Ogomi, Chiyoda-ku (JP); Kenji Shimohata, Chiyoda-ku (JP); Hiroyuki Asano, Chiyoda-ku (JP); Jin Inoue, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 59 days.

(21) Appl. No.: 15/327,792

(22) PCT Filed: Jul. 24, 2015

(86) PCT No.: PCT/JP2015/071086
§ 371 (c)(1),
(2) Date: Jan. 20, 2017

(87) PCT Pub. No.: WO2016/013650
PCT Pub. Date: Jan. 28, 2016

(65) Prior Publication Data
US 2017/0205474 A1    Jul. 20, 2017

(30) Foreign Application Priority Data

Jul. 25, 2014 (JP) ................. 2014-151579

(51) Int. Cl.
*G01R 33/09* (2006.01)
*G07D 7/04* (2016.01)

(52) U.S. Cl.
CPC ........ *G01R 33/096* (2013.01); *G01R 33/091* (2013.01); *G01R 33/093* (2013.01); *G01R 33/098* (2013.01); *G07D 7/04* (2013.01)

(58) Field of Classification Search
CPC ....... G01R 33/096; G01R 33/091; G07D 7/04
See application file for complete search history.

(56) References Cited

U.S. PATENT DOCUMENTS 5,512,822 A * 4/1996 Masuda ................. G06K 7/087
                                                    209/569
5,644,226 A * 7/1997 Aoyama ................ G01D 5/147
                                                    324/207.21

(Continued)

FOREIGN PATENT DOCUMENTS

CN    103038659 A    4/2013
CN    103842838 A    6/2014

(Continued)

OTHER PUBLICATIONS

Japanese Office Action dated Sep. 12, 2017 in Japanese Patent Application No. 2016-535988 (with English translation).

(Continued)

*Primary Examiner* — Tung X Nguyen
*Assistant Examiner* — Dominic E Hawkins
(74) *Attorney, Agent, or Firm* — Oblon, McClelland, Maier & Neustadt, L.L.P.

(57) ABSTRACT

A magnetic sensor device includes: a magnetic field generator, disposed at one surface side of a sheet-like to-be-detected object including a magnetic component, to generate an intersecting magnetic field intersecting the object; and a magnetoresistive effect element disposed between the object and the magnetic field generator, having a resistance value changing in accordance with change of a component of the intersecting magnetic field in a conveyance direction along which the object is conveyed, when the object is conveyed. The magnetoresistive effect element includes resistive elements adjacent to each other in the conveyance direction and interconnected by a bridge, disposed in linear symmetry relative to an axis perpendicular to the conveyance direction and extending through a center of the bridge. A position in the conveyance direction of the bridge center of the mag- (Continued)

netoresistive effect element coincides with a position in the conveyance direction of the magnetic field generator center.

5 Claims, 17 Drawing Sheets

(56) References Cited

U.S. PATENT DOCUMENTS

| | | | | |
|---|---|---|---|---|
| 6,452,381 B1* | 9/2002 | Nakatani | ................ | G01D 5/147 |
| | | | | 324/207.21 |
| 7,663,360 B2* | 2/2010 | Matsumoto | ............ | G01D 5/145 |
| | | | | 324/207.2 |
| 9,244,135 B2* | 1/2016 | Ogomi | ................ | G01R 33/096 |
| 9,279,866 B2* | 3/2016 | Ogomi | ................ | G01R 33/096 |
| 2003/0155909 A1* | 8/2003 | Steinruecken | ......... | G01D 5/147 |
| | | | | 324/207.2 |
| 2006/0279280 A1* | 12/2006 | Minamitani | ............ | G01R 33/09 |
| | | | | 324/252 |
| 2010/0165535 A1* | 7/2010 | Pohl | ...................... | H01F 7/1615 |
| | | | | 361/160 |
| 2013/0020900 A1* | 1/2013 | Takeuchi | ................ | B60L 50/20 |
| | | | | 310/214 |
| 2013/0127457 A1* | 5/2013 | Musha | ................... | B82Y 25/00 |
| | | | | 324/252 |
| 2014/0028308 A1* | 1/2014 | Ogomi | ................ | G01R 33/096 |
| | | | | 324/252 |
| 2014/0232379 A1* | 8/2014 | Nazarian | ................ | G01D 5/147 |
| | | | | 324/207.21 |

FOREIGN PATENT DOCUMENTS

| | | |
|---|---|---|
| JP | 6-18278 A | 1/1994 |
| JP | 7-294540 A | 11/1995 |
| JP | 2000-39472 A | 2/2000 |
| JP | 2012-255770 A | 12/2012 |
| WO | 2012/014546 A1 | 2/2012 |

OTHER PUBLICATIONS

International Search Report dated Oct. 6, 2015 in PCT/JP2015/071086 filed Jul. 24, 2015.

Combined Office Action and Search Report dated Aug. 21, 2018 in Chinese Patent Application No. 201580039331.9, 15 pages (with English translation and English translation of categories of cited documents).

Second Office Action issued in corresponding Chinese Application No. 201580039331.9 dated Mar. 8, 2019, 19 pages (with English translation).

* cited by examiner

FIG.6A    FIG.6B    FIG.6C
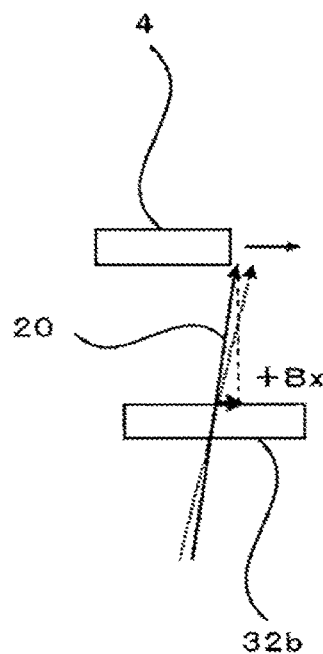
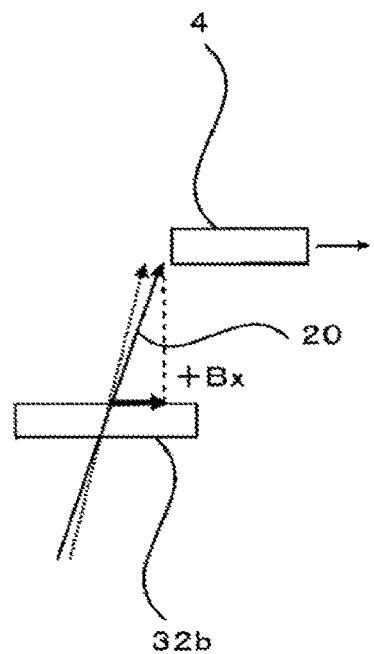
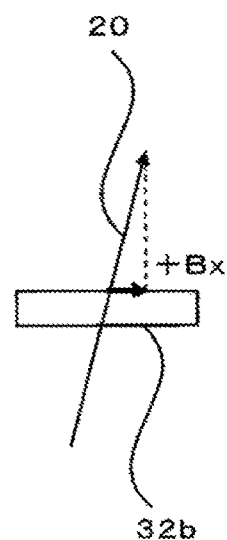
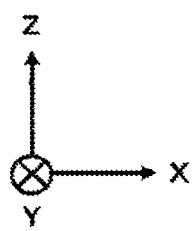

FIG.7A  FIG.7B  FIG.7C
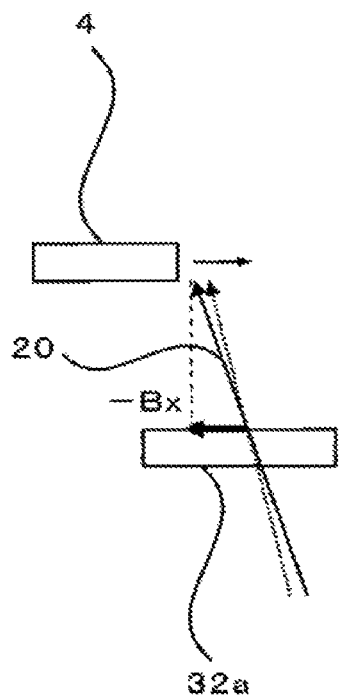
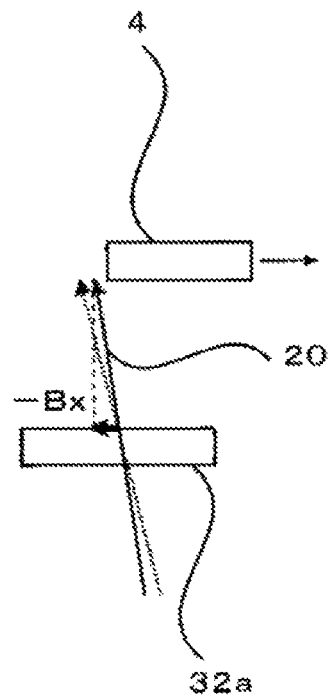
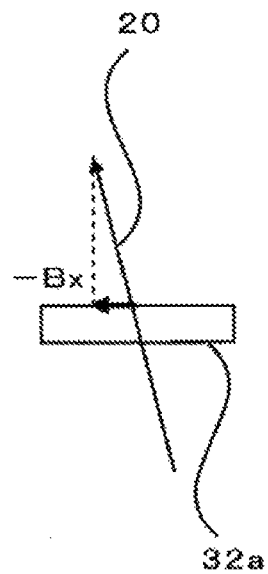
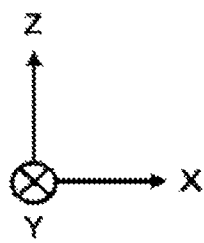

MAGNETIC SENSOR DEVICE

TECHNICAL FIELD

The present disclosure relates to a magnetic sensor device for detection of a magnetic component included in a sheet-like to-be-detected object.

BACKGROUND ART

A magnetic sensor device equipped with a magnet and a magnetoresistive effect element is disclosed in Unexamined Japanese Patent Application Kokai Publication No. 2012-255770 (Patent Literature 1). This magnet generates an intersecting magnetic field that intersects a to-be-detected object. Further, this magnetoresistive effect element is arranged between the magnet and the to-be-detected object, has an output terminal, and outputs, as a change of resistance value, change of a conveyance direction component of the intersecting magnetic field due to a magnetic component of the to-be-detected object conveyed within the intersecting magnetic field. A configuration for generation of the intersecting magnetic field as disclosed in Patent Literature 1 includes a configuration in which magnets are arranged to oppose each other with the object therebetween and a configuration in which a magnet is arranged to oppose one surface of the object and a magnetic body is arranged to oppose another surface of the object.

CITATION LIST

Patent Literature

Patent Literature 1: Unexamined Japanese Patent Application Kokai Publication No. 2012-255770

SUMMARY OF INVENTION

Technical Problem

The invention described in Patent Literature 1 requires, at both surfaces of the to-be-detected object having a magnetic body, a configuration for generating the intersecting magnetic field, and large size of the magnetic sensor device is a problem.

The present disclosure is developed to solve the aforementioned problem, and an objective of the present disclosure is to obtain a small-sized magnetic sensor device.

Solution to Problem

The magnetic sensor device of the present disclosure includes: a magnetic field generator, disposed at one surface side of a sheet-like to-be-detected object including a magnetic component, to generate an intersecting magnetic field intersecting the to-be-detected object; and a magnetoresistive effect element disposed between the to-be-detected object and the magnetic field generator, and having a resistance value that changes in accordance with change of a component of the intersecting magnetic field in a conveyance direction along which the to-be-detected object is conveyed, the change occurring when the to-be-detected object is conveyed in the conveyance direction. The magnetoresistive effect element comprises a first resistive element and a second resistive element adjacent to each other in the conveyance direction and interconnected by a bridge, a conveyance-direction center of a gap between the first resistive element and the second resistive element being disposed at the conveyance-direction center of the magnetic field generator, one end of the first resistive element being connected in common with one end of the second resistive element to form a bridge connection, the first resistive element and the second resistive element are disposed in linear symmetry relative to an axis perpendicular to the conveyance direction and extending through a center of the bridge, and a position in the conveyance direction of the center of the bridge of the magnetoresistive effect element coincides with a position in the conveyance direction of the center of the magnetic field generator, and a gap between the first resistive element and the second resistive element increases from the one end of the first resistive element and the second resistive element toward another end of the first resistive element and the second resistive element in a direction perpendicular to the conveyance direction.

Advantageous Effects of Invention

In the present disclosure, a magnetic field generator is arranged at one surface side of a to-be-detected object that includes a magnetic component. Thus according to the present disclosure, the magnetic field generator becomes small-sized, and a small-sized magnetic sensor device is obtained. Further, a bias magnetic flux is applied in mutually opposite directions to the magnetoresistive effect element that includes a bridge, and thus the output becomes doubled.

BRIEF DESCRIPTION OF DRAWINGS

FIG. 6 illustrates vector diagrams of magnetic flux lines for explanation of principles of sensing by the magnetic sensor device of Embodiment 1 of the present disclosure;

FIG. 7 illustrates vector diagrams of magnetic flux lines for explanation of principles of sensing by the magnetic sensor device of Embodiment 1 of the present disclosure;

FIG. 12 is a cross-sectional drawing of the configuration of FIG. 11 after removal of a yoke 2a;

FIG. 14 is a cross-sectional drawing of the configuration of FIG. 13 after removal of a yoke 2a;

FIG. 16 is a cross-sectional drawing of the configuration of FIG. 15 after removal of the yoke 2a.

DESCRIPTION OF EMBODIMENTS

Embodiment 1

Figure 1:
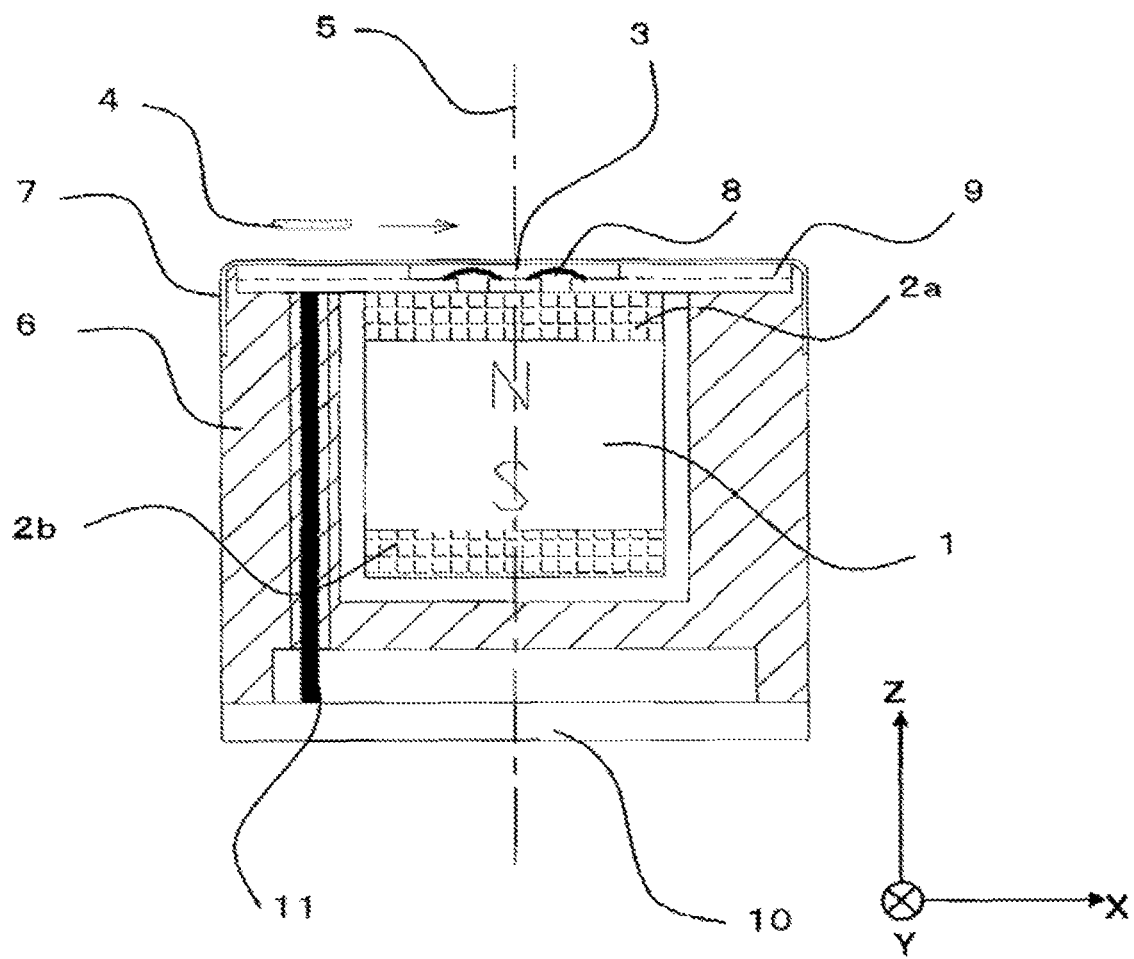
FIG. 1 is a drawing of a cross section, parallel to a conveyance direction of a to-be-detected object, of a magnetic sensor device of Embodiment 1 of the present disclosure.
Figure 2:
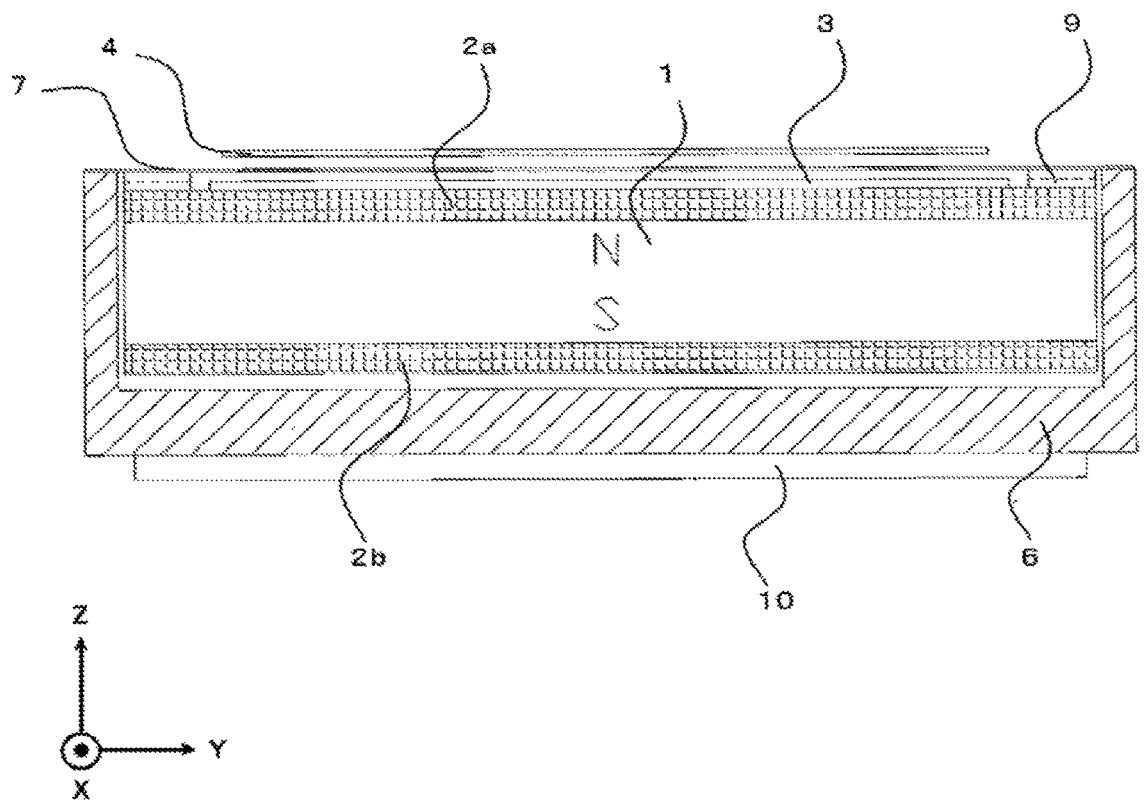
FIG. 2 is a drawing of a cross section, as viewed in an insertion-ejection direction of the to-be-detected object, of the magnetic sensor device of Embodiment 1 of the present disclosure.

FIG. 1 is a drawing of a cross section, parallel to a conveyance direction of a to-be-detected object, of a magnetic sensor device of Embodiment 1 of the present disclosure. FIG. 2 is a drawing of a cross section, as viewed in the insertion-ejection direction of the to-be-detected object, of the magnetic sensor device of Embodiment 1 of the present disclosure.

A permanent magnet 1 is a permanent magnet that has N and S magnetic poles oriented in a Z-axis direction (magnetization direction) and that forms a magnetic field generator. The permanent magnet 1 has the N pole on the to-be-detected object 4 side, and has the S pole on a side opposite to the to-be-detected object 4 side. A yoke 2a and a yoke 2b are formed from a soft magnetic body material such as iron. The yoke 2a is arranged at the upper surface side (N pole side in the figure) of the permanent magnet 1, which is the to-be-detected object 4 side. The yoke 2b is arranged at the lower surface side (S pole side in the figure) of the permanent magnet 1, which is opposite to the to-be-detected object 4 side. The yoke 2a and yoke 2b form parts of the magnetic field generator. Further, although the yoke 2b is arranged with the objective of increasing the main magnetic flux (+Bz) of the permanent magnet 1, yoke 2b is not necessarily required, and a case without yoke 2b is also envisioned.

An anisotropic magnetoresistive effect chip 3 (referred to in the present disclosure as the AMR chip), mounted on an upper surface that is the yoke 2a to-be-detected object 4 side, outputs a change of magnetic flux as a change of a resistance value. A board 9 formed of resin such as glass-epoxy is mounted on the upper surface that is the yoke 2a to-be-detected object 4 side and surrounds the AMR chip 3. Thus the yoke 2a also performs the role of a carrier of the AMR chip 3. The board 9 is connected by metal wirings 8 to a power source line, GND line and signal line of the AMR chip 3. Further, a conveyance path side, at which the to-be-detected object 4 is conveyed, of the board 9 and AMR chip 3 is covered by a metal shield plate 7. The metal shield plate 7 is non-magnetizable and passes magnetic flux lines. A signal processing circuit board 10 is arranged at a lower portion of a housing 6, which is arranged opposite to the to-be-detected object 4 side of the housing 6. The board 9 and the signal processing circuit board 10 are connected by a cable 11.

The to-be-detected object 4 is a sheet-like to-be-detected object such as paper currency on which a magnetic body such as magnetic ink is printed. The to-be-detected object 4, for example, is a paper sheet-like printing medium on which are formed fine magnetic pattern, that is, printed characters. The magnetic sensor device, for example, is a device for detection of paper currency, such as by detection of fine magnetic patterns printed on the paper currency. A central axis 5 is the central axis of the permanent magnet 1 in the X-axis direction. That is to say, the central axis 5 passes through the X-direction center (center of gravity) of the permanent magnet 1 and extends in the vertical direction. Further, the X-axis direction is indicated by an arrow and is the conveyance direction of the to-be-detected object 4. That is to say, the conveyance direction of the to-be-detected object 4 is the +X-axis direction. Further, the Y axis is perpendicular to the X axis and Z axis, and is the reading-width direction of the to-be-detected object 4. The Z-axis direction is perpendicular to the X axis and Y axis, and is perpendicular to the conveyance direction.

Figure 3:
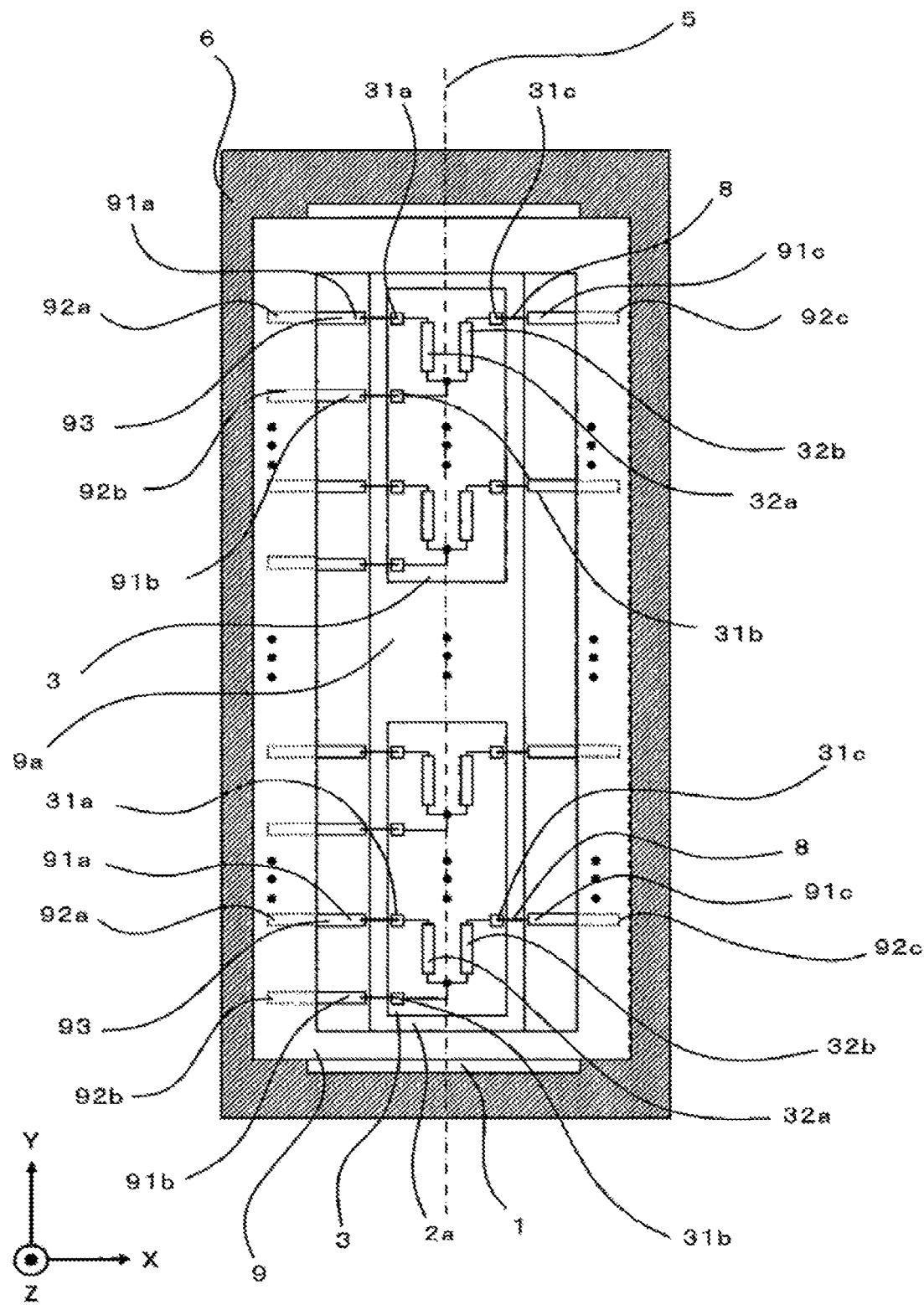
FIG. 3 is a top view showing mounted state of an AMR chip and a board side from above as viewed in FIG. 1.

FIG. 3 is a top view showing mounted state of an AMR chip and a board side as viewed from the conveyance path of the to-be-detected object in FIG. 1. In FIG. 3, the board 9 is fixed to the yoke 2a. This board 9 has a hole 9a, and in the case of a large-scale circuit, may be formed as a multi-layer board.

The AMR chip 3, so as to be surrounded by the board 9, is fixed by adhesive and the like to the surface of the yoke 2a exposed in the hole 9a. An electrode 31a of the AMR chip 3 is connected by the metal wiring 8 to an electrode 91a arranged on the board 9, an electrode 31b of the AMR chip 3 is connected by the metal wiring 8 to an electrode 91b arranged on the board 9, and an electrode 31c of the AMR chip 3 is connected by the metal wiring 8 to an electrode 91c arranged on the board 9. An exterior pad 92a, exterior pad 92b and exterior pad 92c, which are arranged on the exterior backside of the board 9, are connected through a transmission line 93 to the electrode 91a, electrode 91b and electrode 91c. The exterior pad 92a, exterior pad 92b and exterior pad 92c are connected to external circuits such as an amplifier circuit, signal processing circuit and bias voltage circuit. Further, the hole 9a of the board may be sealed by resin and the like in order to protect the AMR chip 3 and metal wiring 8.

In FIG. 3, an AMR element 32a and an AMR element 32b, which are resistive elements of the magnetoresistive effect element chip (AMR chip 3), are formed on the AMR chip 3. The AMR element 32a and AMR element 32b are rectangle-shaped, and the long sides of the rectangle shapes are arranged parallel and extending in the reading-width direction (Y axis direction). One end of each of the AMR element 32a and the AMR element 32b are connected in common to form a series connection of the AMR element 32a and the AMR element 32b adjacent to each other in the to-be-detected object 4 conveyance direction. This series-connected portion of the AMR element 32a and AMR element 32b is connected to the electrode 31b of the AMR chip 3, the other end of the AMR element 32a is connected to the electrode 31a, and the other end of the AMR element 32b is connected to the electrode 31c. That is to say, the series-connected portion of the AMR element 32a and AMR element 32b adjacent to one another in the conveyance direction of the to-be-detected object 4 is used as the starting point of bridge connection between the AMR element 32a and AMR element 32b on the AMR chip 3. Further, the AMR element 32a and AMR element 32b are arranged with linear symmetry relative to an axis centered on the central axis 5, which is also the reading-width direction (Y direction) axis perpendicular to the conveyance direction of the to-be-detected object 4. That is to say, the center of a conveyance-direction gap between the AMR element 32a and AMR element 32b adjacent to each other in the to-be-detected object 4 conveyance direction, that is, the center of the bridge between the AMR element 32a and AMR element 32b adjacent to each other in the to-be-detected object 4 conveyance direction, is arranged on the central axis 5.

Figure 4:
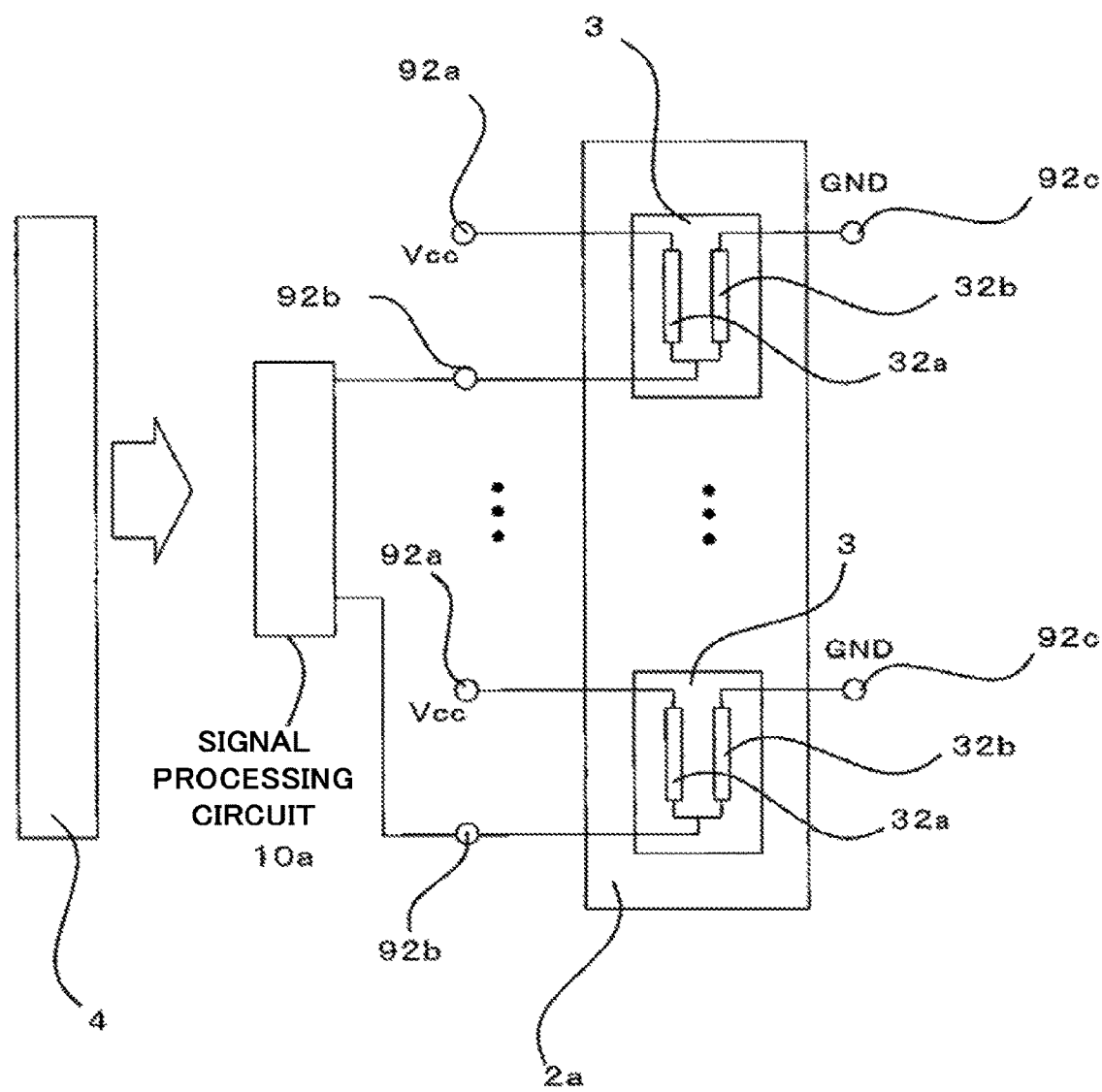
FIG. 4 is a connection diagram showing connected state of an external circuit and AMR elements of the magnetic sensor device of Embodiment 1 of the present disclosure.
Figure 4:
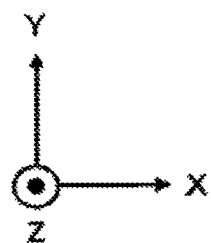

FIG. 4 is a connection diagram showing connected state of an external circuit and the AMR chip of the magnetic sensor device of Embodiment 1 of the present disclosure. The AMR element 32a and AMR element 32b are connected in series between a DC power source voltage Vcc and a DC ground (GND). A signal processing circuit 10a for signal processing, mounted on the signal processing circuit board 10, is connected to the series-connected portion between the AMR element 32a and AMR element 32b. The exterior pad 92a is connected to the DC power source voltage Vcc, the exterior pad 92b is connected to the signal processing circuit 10a, and the exterior pad 92c is connected to the DC ground (GND). That is to say, the series connected portion between the AMR element 32a and AMR element 32b adjacent to each other in the to-be-detected object 4 conveyance direction is connected to the signal processing circuit 10a through the exterior pad 92b. The other end of the AMR element 32a is connected to the DC power source voltage Vcc through the exterior pad 92a. The other end of the AMR element 32b is connected to the DC ground (GND) through the exterior pad 92c.

Figure 5:
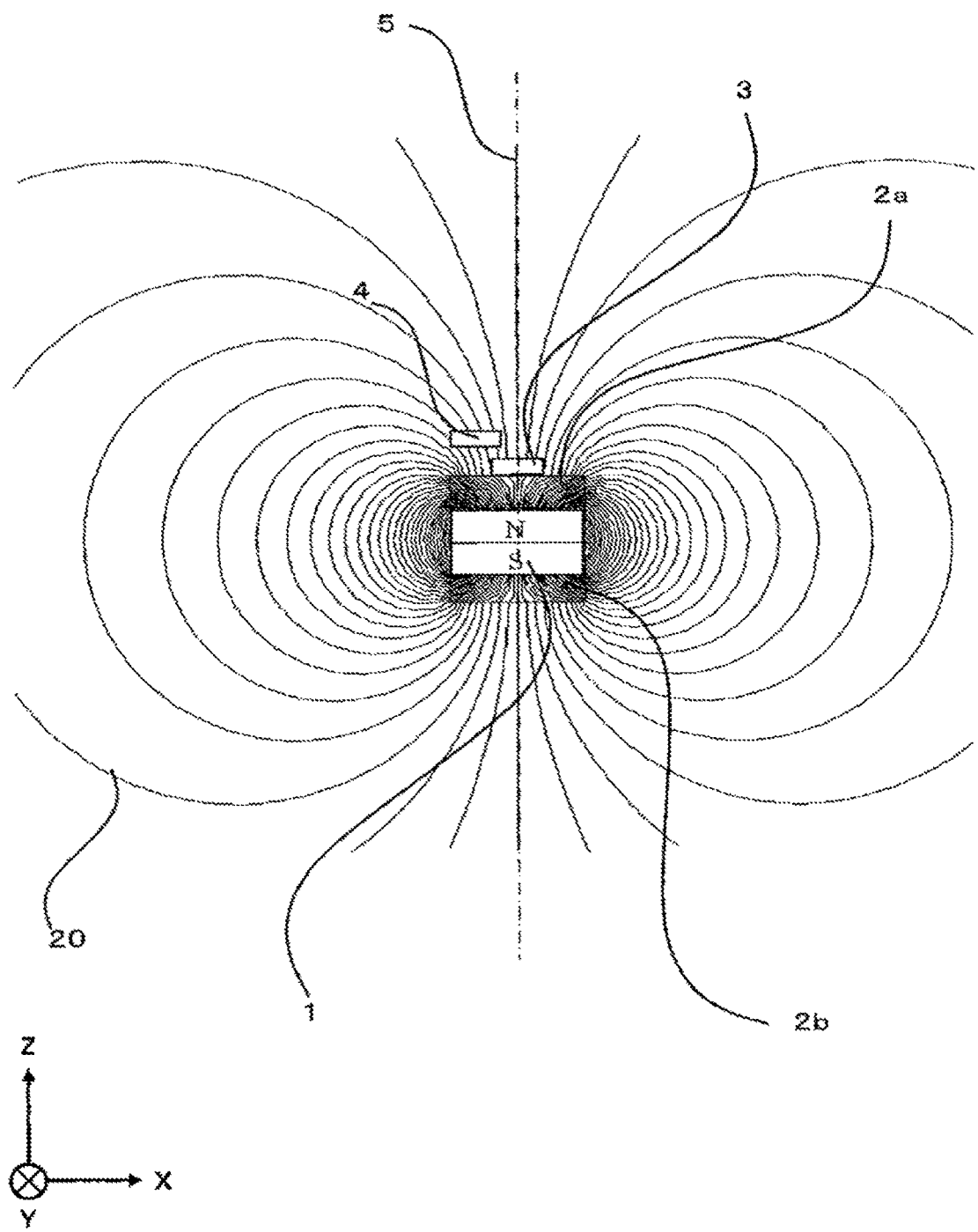
FIG. 5 is a drawing illustrating a distribution of magnetic flux lines generated by a magnet and yoke in the magnetic sensor device of Embodiment 1 of the present disclosure.

FIG. 5 is a drawing illustrating a distribution of magnetic flux lines generated by the magnet and yoke in the magnetic sensor device of Embodiment 1 of the present disclosure. Further, from among the constituent elements of FIG. 1, the constituent elements necessary for description of the magnetic flux line distribution are indicated in FIG. 5, and other constituent elements are omitted. FIG. 6 illustrates vector diagrams of magnetic flux lines for explanation of principles of sensing by the magnetic sensor device of Embodiment 1 of the present disclosure. FIG. 6 corresponds to the AMR element 32b. When viewed in the XZ plane in FIG. 5, a magnetic flux line 20 generated from the N pole of the magnet 1 passes through a yoke 2a arranged at the N-pole side of the magnet 1, and is released to the exterior of the magnet 1 and yoke 2a from an XY surface and a YZ surface of the yoke 2a. A yoke 2b is arranged at the S-pole side of the magnet 1, and the magnetic flux line 20 released to the exterior of the magnet 1 and yoke 2a enters the yoke 2b from the XY surface and YZ surface thereof. The magnetic flux line 20 entering the yoke 2b passes through the yoke 2b and is concentrated at the S pole of the magnet 1.

As shown in FIG. 5, due to the characteristic that is the magnetic flux line 20 perpendicularly (Bz direction) entering a pole surface of the magnetic body, in the vicinity of the yoke 2a, the X-axis direction magnetic flux density component (Bx) becomes extremely small, and the magnetic flux density component (Bz) in the magnetization direction (Z-axis direction) of the permanent magnet 1 becomes the major component. The AMR chip 3 is arranged on the surface of the yoke 2a, where the component Bx is quite small and the magnetic flux density component (Bz) in the magnetization direction (Z-axis direction) of the permanent magnet 1 is strong. The to-be-detected object 4 passes through the position where the magnetic flux density component (Bz) of the magnetization direction (Z-axis direction) of the permanent magnet 1 has a strong magnetic field strength such that the to-be-detected object 4 intersects the magnetic field of the magnetization direction (Z-axis direction) of the permanent magnet 1.

In the AMR chip 3 conveyance direction, the center (center between the AMR element 32a and AMR element 32b) is arranged at the center of the magnet 1 and yoke 2a. In FIG. 5, in the vicinity of the location of arrangement of the AMR element 32a and AMR element 32b on the AMR chip 3, the component toward the +Z axis from the N pole of the magnet 1 of the intersecting magnetic field that intersects the conveyance path, becomes the major component of the magnetic flux lines 20. On the AMR element 32b, as illustrated in diagram of FIG. 6A, the magnetic flux line 20 is tilted from the Z-axis direction slightly toward the conveyance direction (X-axis direction), and thus for the magnetic flux density indicated by this magnetic flux line 20, the component (+Bx) in the conveyance direction (X-axis direction) acts as a bias magnetic flux of the AMR element 32b. Conversely, on the AMR element 32a, due to tilt from the Z direction by a small amount in the direction opposite (−X-axis direction) to the conveyance direction, the component of this magnetic flux opposite (−X-axis direction) to the conveyance direction acts as the bias magnetic flux of the AMR element 32a.

At the AMR element 32b, when the to-be-detected object 4 (paper currency) having the magnetic pattern approaches the AMR element 32b, as illustrated in FIG. 6B, the magnetic flux density (+Bx) in the conveyance direction (X-axis direction) becomes small due to tilting of the magnetic flux line 20 toward the magnetic pattern side, that is, toward the side (−X-axis direction) opposite to the conveyance direction. When the to-be-detected object (paper currency) 4 (magnetic pattern) becomes separated from the AMR element 32b, as illustrated in FIG. 6C, the magnetic flux density (+Bx) in the conveyance direction (X-axis direction) becomes large due to tilting of the magnetic flux line 20 toward the magnetic pattern side, that is, toward the conveyance direction (+X-axis direction). Thus change occurs in the resistance value of the AMR element 32b sensing the magnetic X-direction component, enabling detection of the magnetic pattern. Further, in FIG. 6B and FIG. 6C, the dotted-line arrow indicates the bias magnetic flux prior to the approach of the to-be-detected object 4, that is, indicates the position of the magnetic flux line 20 illustrated in FIG. 6A.

FIG. 7 illustrates vector diagrams of magnetic flux lines for explanation of principles of sensing by the magnetic sensor device of Embodiment 1 of the present disclosure. FIG. 7 corresponds to the AMR element 32a. On the AMR element 32a as illustrated in FIG. 7A, the magnetic flux line 20 tilts from the Z-axis direction somewhat toward the direction opposite (−X-axis direction) to the conveyance direction, and thus the component (−Bx) of the conveyance direction-opposite side (−X-axis direction) of the magnetic flux density illustrated by this magnetic flux line 20 acts as the bias magnetic flux of the AMR element 32a. At the AMR element 32a, when the to-be-detected object 4 (paper currency) having the magnetic pattern approaches the AMR element 32a, as illustrated in FIG. 7B, the magnetic flux density (−Bx) in the conveyance-opposite direction (−X-axis direction) becomes large due to tilting of the magnetic flux line 20 toward the magnetic pattern side, that is, toward the side (−X-axis direction) opposite to the conveyance direction. When the to-be-detected object (paper currency) 4 (magnetic pattern) becomes separated from the AMR element 32a, as illustrated in FIG. 7C, the magnetic flux density (−Bx) in the conveyance-opposite direction (−X-axis direction) becomes small due to tilting of the magnetic flux line 20 toward the magnetic pattern side, that is, toward the conveyance direction (+X-axis direction). Thus the resistance value of the AMR element 32a sensing the magnetic X-direction component changes, enabling detection of the magnetic pattern. Further, in FIG. 7B and FIG. 7C, the dotted-line arrow indicates the bias magnetic flux prior to the approach of the to-be-detected object 4, that is, indicates the position of the magnetic flux line 20 illustrated in FIG. 7A.

The point of series connection between the AMR element 32a and AMR element 32b lies on the central axis 5, and the AMR element 32a and AMR element 32b are arranged with linear symmetry relative to the central axis 5. Thus operation of the AMR element 32a is opposite to operation of the AMR element 32b. Thus the bridge output of the AMR element 32a and AMR element 32b becomes a two-fold change, and an output is obtained that is twice that of a normal bridge output.

Figure 8:
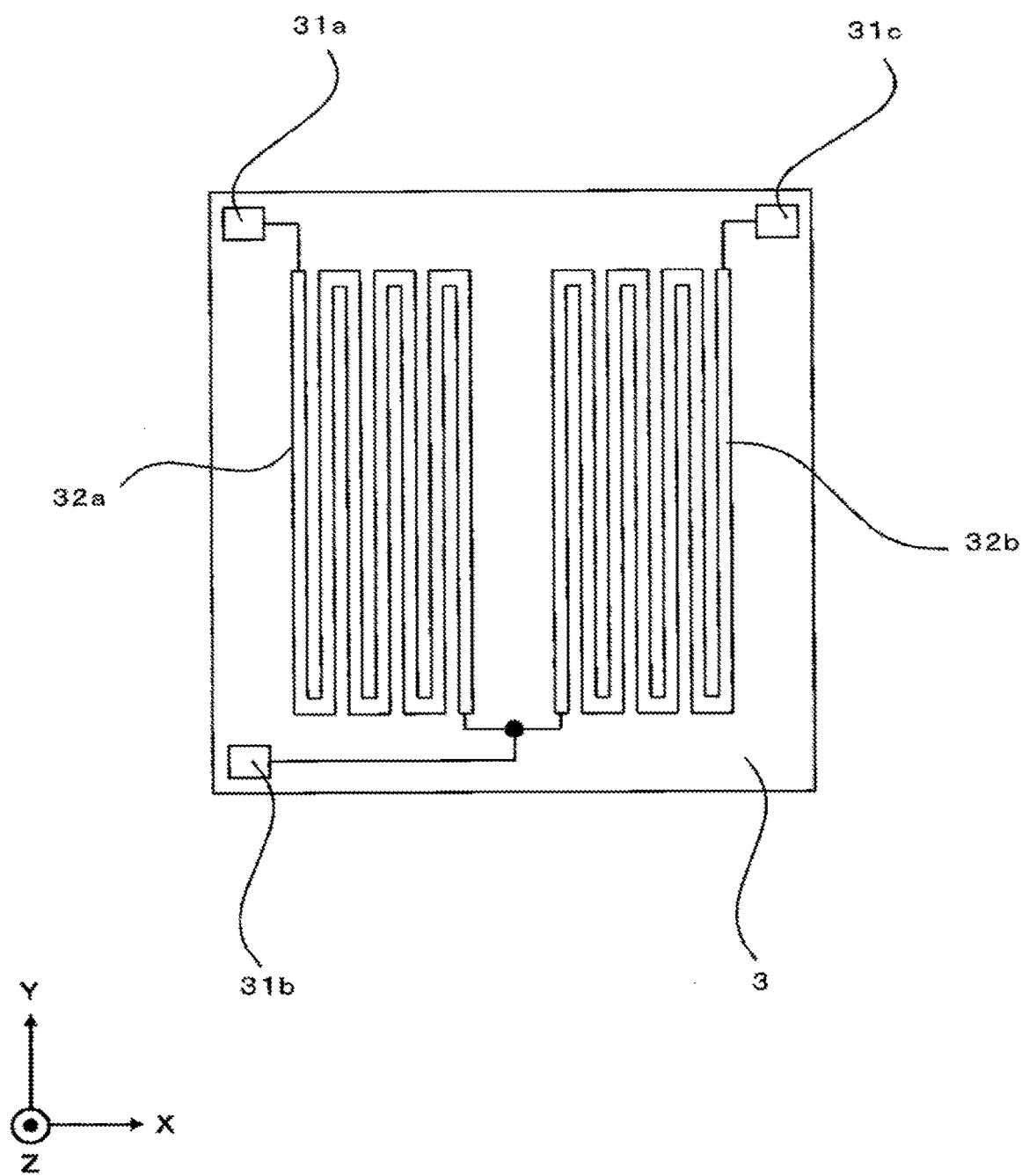
FIG. 8 is a top view of an AMR element that has a meanderingly-shaped resistance pattern.

FIG. 8 is a top view of an AMR chip that has a meanderingly-shaped resistance pattern. Although the AMR element 32a and AMR element 32b on the AMR chip 3 in FIG. 3 are rectangle-shaped, as illustrated in FIG. 8, a meandering shape may be used by an arrangement that extends the long side in the reading-width direction (Y-axis direction). In this case, resistance value of the AMR element 32a and AMR element 32b increases relative to the rectangle-shaped configuration, and the resistance value becomes high. Thus detection sensitivity of a change in the magnetic flux of the AMR element 32a and AMR element 32b improves, and detection sensitivity of the magnetic sensor device increases.

Figure 9:
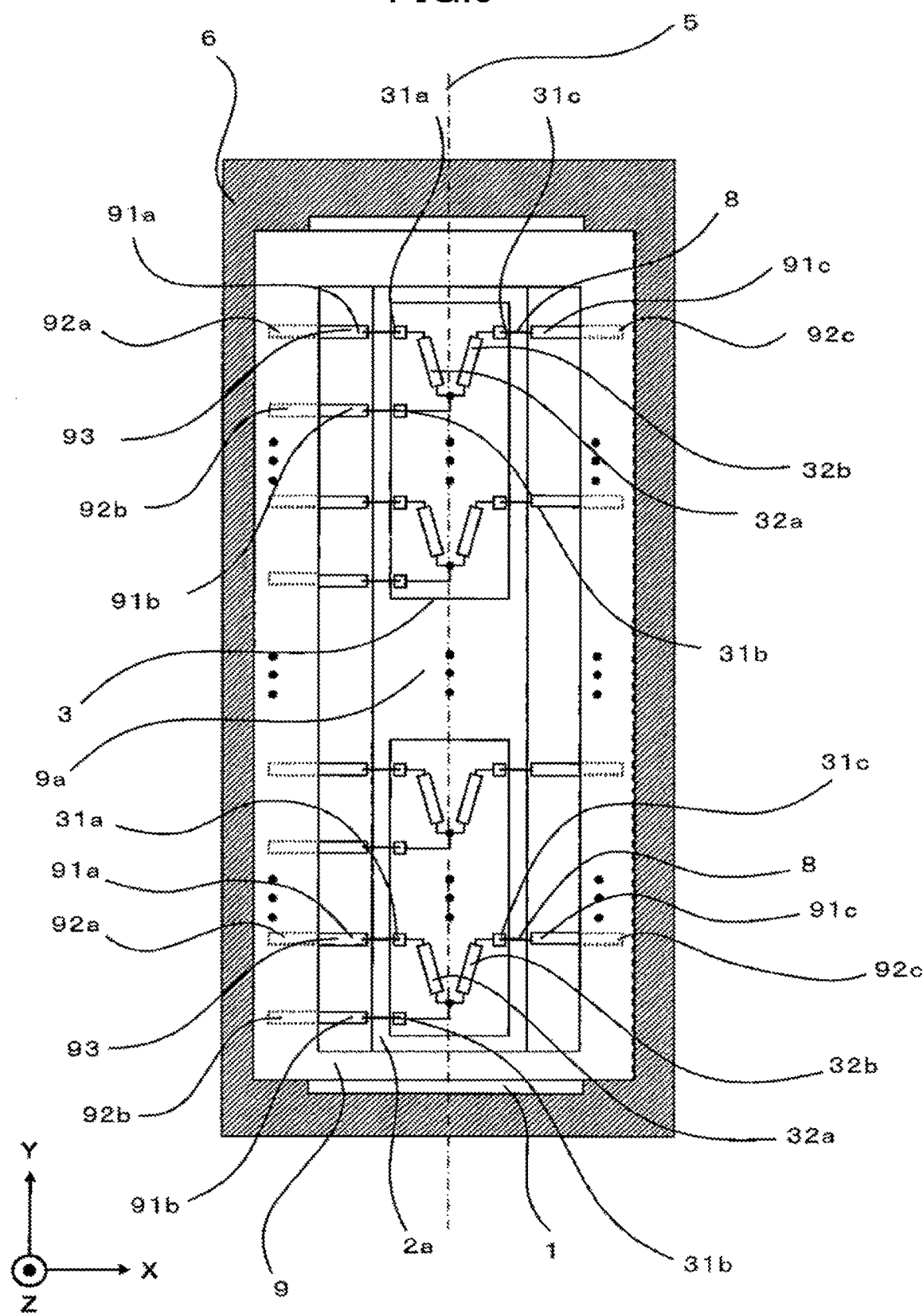
FIG. 9 is a top view showing mounted state of an AMR chip, as viewed from a conveyance path of the to-be-detected object in FIG. 1 toward the board, in which the arrangement of the AMR element 32a and AMR element 32b of FIG. 3 is modified.

FIG. 9 is a top view showing mounted state of the AMR chip, as viewed from a conveyance path of the to-be-detected object in FIG. 1 toward the board side, in which the arrangement of the AMR element 32a and AMR element 32b of FIG. 3 is modified. In FIG. 3, the AMR element 32a and AMR element 32b on the AMR chip 3 are rectangle-shaped and have long sides parallel to the Y axis and extending in the Y direction. However, as illustrated in FIG. 9, a linearly symmetric arrangement centered on the central axis 5 may be used, in which the AMR element 32a tilts toward the −X-axis direction and the AMR element 32b tilts toward the +X-axis direction. That is to say, for the AMR element 32a and AMR element 32b adjacent to each other in the conveyance direction (X-axis direction), this configuration results in a shape such that the gap between the AMR element 32a and AMR element 32b widens, from the end of the AMR element 32a and AMR element 32b that is the series connection side of the AMR element 32a and AMR element 32b adjacent to each other in the conveyance direction (X-axis direction), and toward the other end of the AMR element 32a and other end of the AMR element 32b in the reading-width direction (Y-axis direction). Due to the bias magnetic field applied in the X-axis direction in this configuration, a magnetic field is applied with a stable length-wise component to the AMR element 32a and AMR element 32b, and thus the hysteresis characteristic of the AMR element 32a and AMR element 32b is suppressed, and stable output can be obtained.

Figure 10:
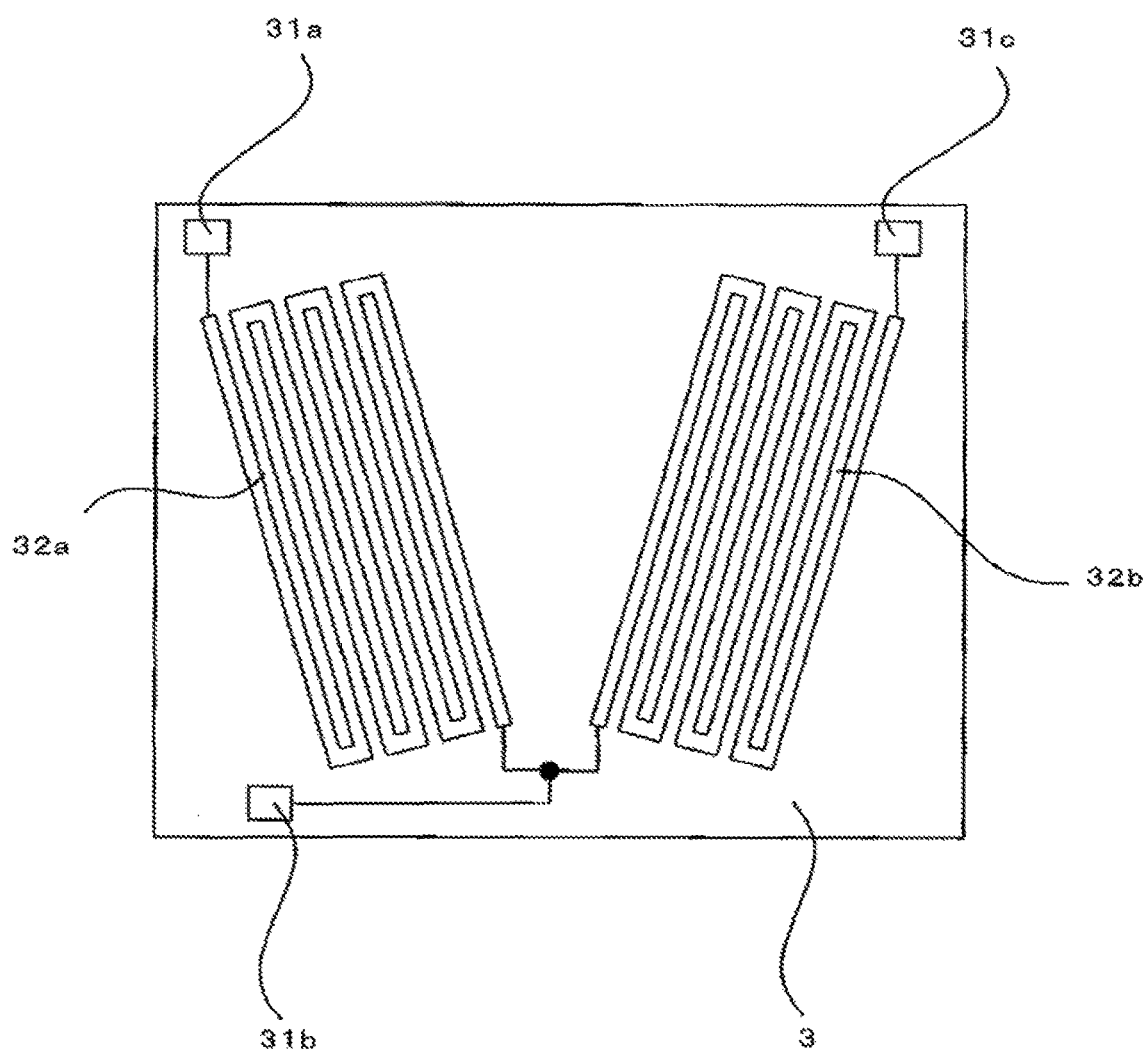
FIG. 10 is a top view of an AMR chip that has a meanderingly-shaped resistance pattern.

FIG. 10 is a top view of an AMR chip that has a meandering-shaped resistance pattern. The AMR element 32a and AMR element 32b on the AMR chip 3 have rectangle shapes in FIG. 9, but may have meandering shapes as illustrated in FIG. 10. In this configuration, resistance value of the AMR element 32a and AMR element 32b increases relative to the rectangle-shaped configuration, and the resistance value becomes high. Thus detection sensitivity of a change in the magnetic flux of the AMR element 32a and AMR element 32b improves, and detection sensitivity of the magnetic sensor device increases.

Further, although AMR elements are used in the present description as the detection elements, a similar effect is obtained by use of giant magnetoresistive effect (GMR) elements and tunnel magnetoresistive effect (TMR) elements.

Embodiment 2

Figure 11:
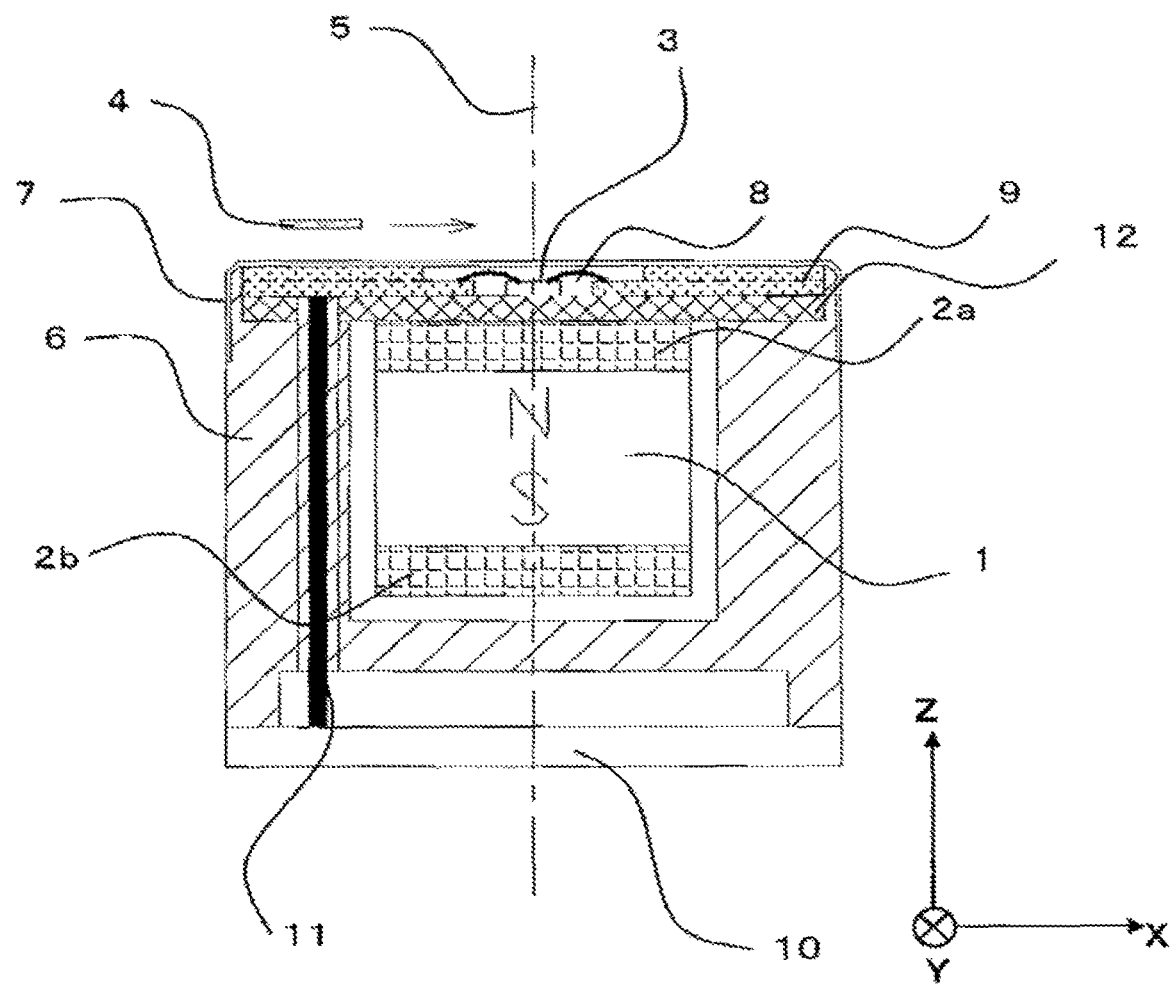
FIG. 11 is a drawing of a cross section, parallel to the conveyance direction of a to-be-detected object, of a magnetic sensor device of Embodiment 2 of the present disclosure.
Figure 12:
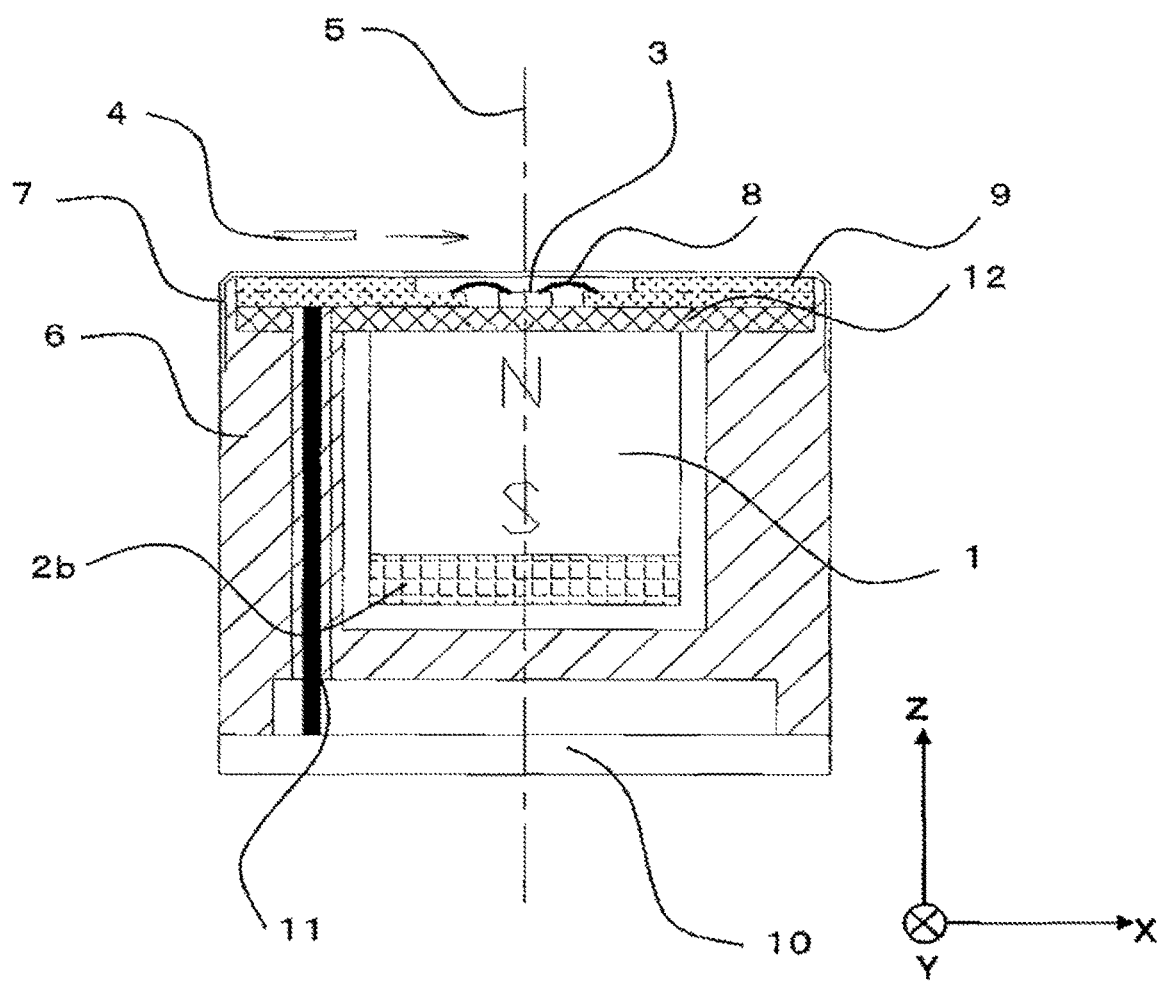

A magnetic sensor device of Embodiment 2 of the present disclosure is described using FIG. 11 and FIG. 12. In FIG. 11 and FIG. 12, constituent elements that are the same or equivalent to those in FIG. 1 are assigned the same reference signs, and description of such constituent elements is omitted. FIG. 11 is a drawing of a cross section, parallel to the conveyance direction of the to-be-detected object 4, of the magnetic sensor device of Embodiment 2 of the present disclosure. In contrast to the Embodiment 1 illustrated in FIG. 1, a non-magnetic carrier 12 is arranged on the upper surface that is the to-be-detected object 4-side of the yoke 2a, and an AMR chip 3 and a board 9 formed from resin such as glass epoxy and surrounding the AMR chip 3 are carried on the upper surface that is the to-be-detected object 4-side of the non-magnetic carrier 12. The other structure is the same as that of Embodiment 1. This configuration makes possible an increase of strength of the board due to arrangement of a non-magnetic carrier 12 on the backside surface of the board 9, which is the side opposite to the to-be-detected object 4 side, and this configuration also contributes to release of heat from the board 9 and AMR chip 3.

FIG. 12 is a cross-sectional drawing of the configuration of FIG. 11 after removal of the yoke 2a. The non-magnetic carrier 12 is arranged on the upper surface (N-pole side in the figure) of the permanent magnet 1, which is the to-be-detected object 4 side. Due to there being no yoke 2a, the present configuration increases the main magnetic flux (+Bz) and makes possible miniaturization of the permanent magnet 1. Further, although the yoke 2b is arranged with the object of causing an increase in the main magnetic flux (+Bz) of the permanent magnet 1, such arrangement is not necessarily required, and a case without such arrangement is also envisioned.

Embodiment 3

Figure 13:
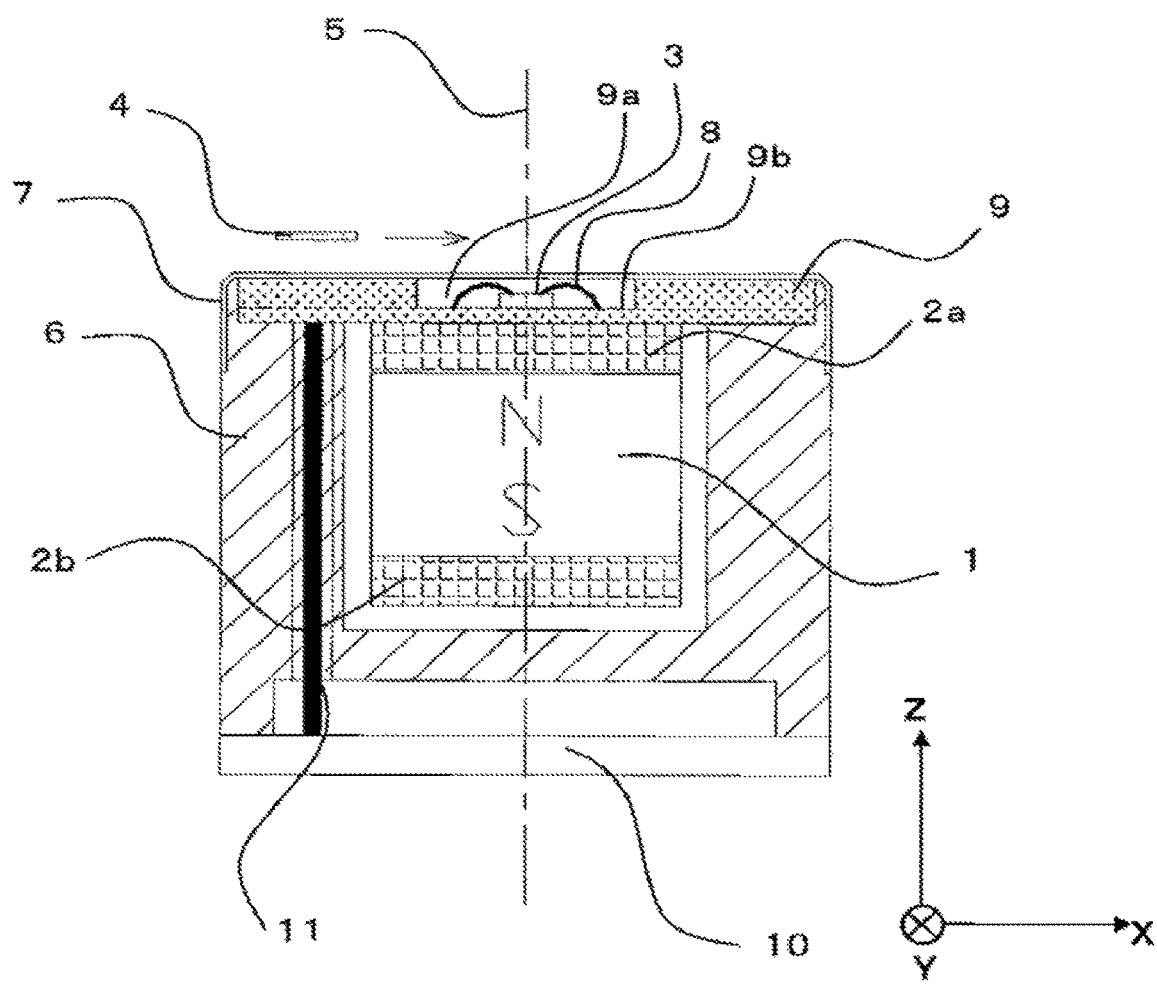
FIG. 13 is a drawing of a cross section, parallel to the conveyance direction of a to-be-detected object, of a magnetic sensor device of Embodiment 3 of the present disclosure.
Figure 14:
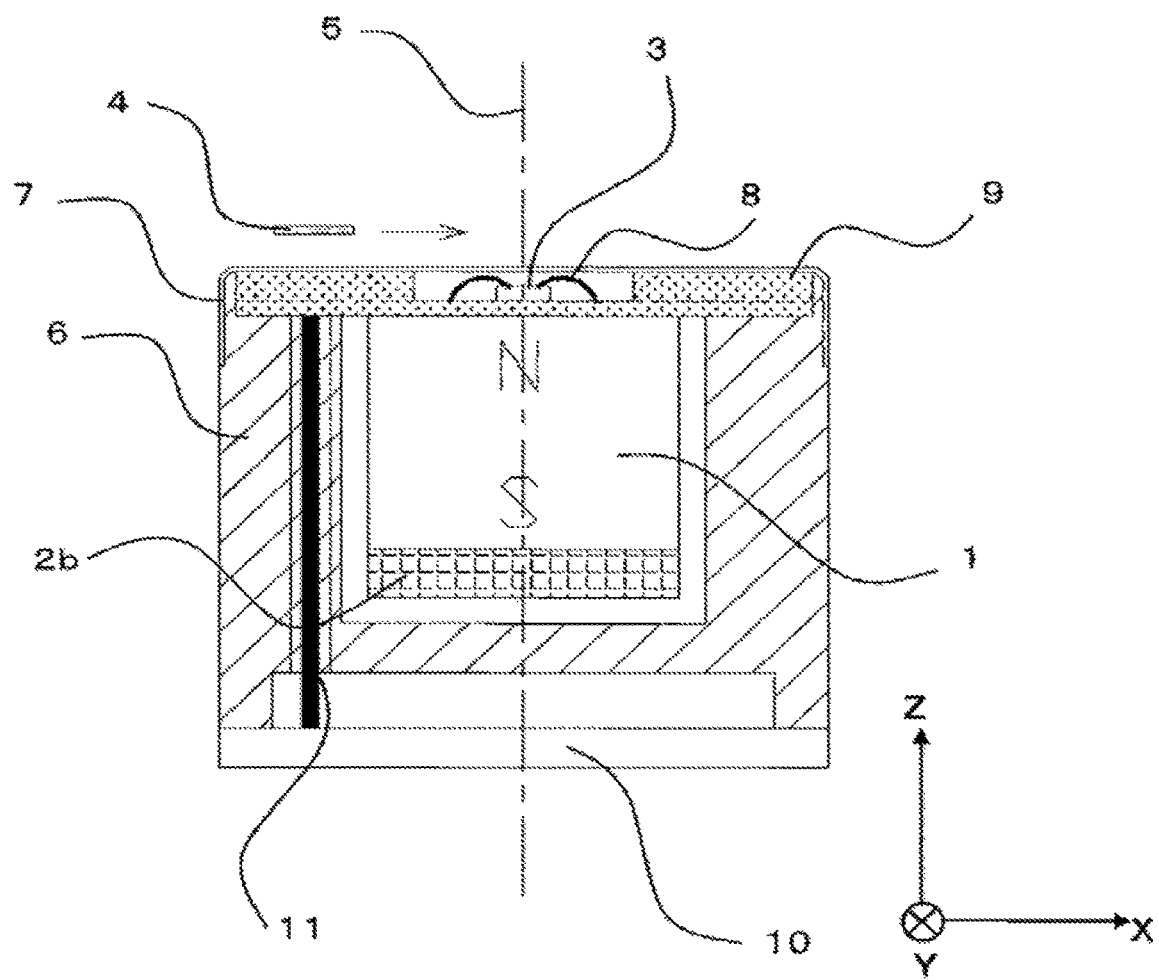

A magnetic sensor device of Embodiment 3 of the present disclosure is described using FIG. 13 and FIG. 14. In FIG. 13 and FIG. 14, constituent elements that are the same or equivalent to those in FIG. 1 are assigned the same reference signs, and description of such constituent elements is omitted. FIG. 13 is a drawing of a cross section, parallel to the conveyance direction of a to-be-detected object 4, of a magnetic sensor device of Embodiment 3 of the present disclosure. The shape of the board 9 is modified relative to Embodiment 1 illustrated in FIG. 1. As viewed in the XZ plane, the board 9 has a stepped structure having a recessed hole 9a. The AMR chip 3 is mounted on the board 9b of the recessed hole 9a of the board 9. The other structure is the same as that of Embodiment 1. Due to a cut-out hole in the board 9 becoming unnecessary, lowering of cost of the board 9 becomes possible. Further, the lack of a large hole in the board enables easy arrangement of the pattern wiring within the board.

FIG. 14 is a cross-sectional drawing of the configuration of FIG. 13 after removal of the yoke 2a. The board 9 is arranged at the upper face (N pole side in the figure) of the permanent magnet 1. Due to there being no yoke 2a, the present configuration increases the main magnetic flux (−Bz) and makes possible miniaturization of the permanent magnet 1. Further, although the yoke 2b is arranged with the object of causing an increase in the main magnetic flux (+Bz) of the permanent magnet 1, such arrangement is not necessarily required, and a case without such arrangement is also envisioned.

Embodiment 4

Figure 15:
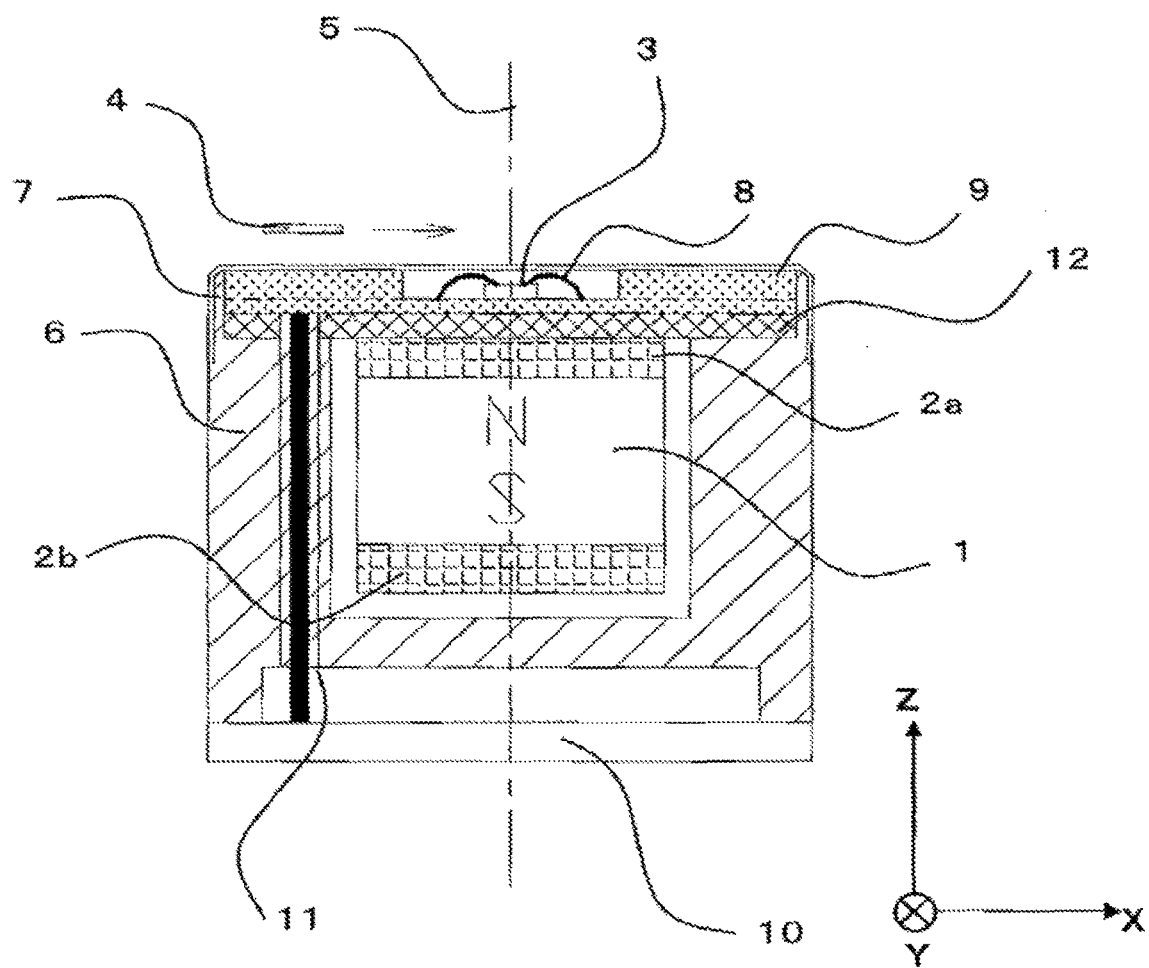
FIG. 15 is a drawing of a cross section, parallel to the conveyance direction of a to-be-detected object, of a magnetic sensor device of Embodiment 4 of the present disclosure.
Figure 16:
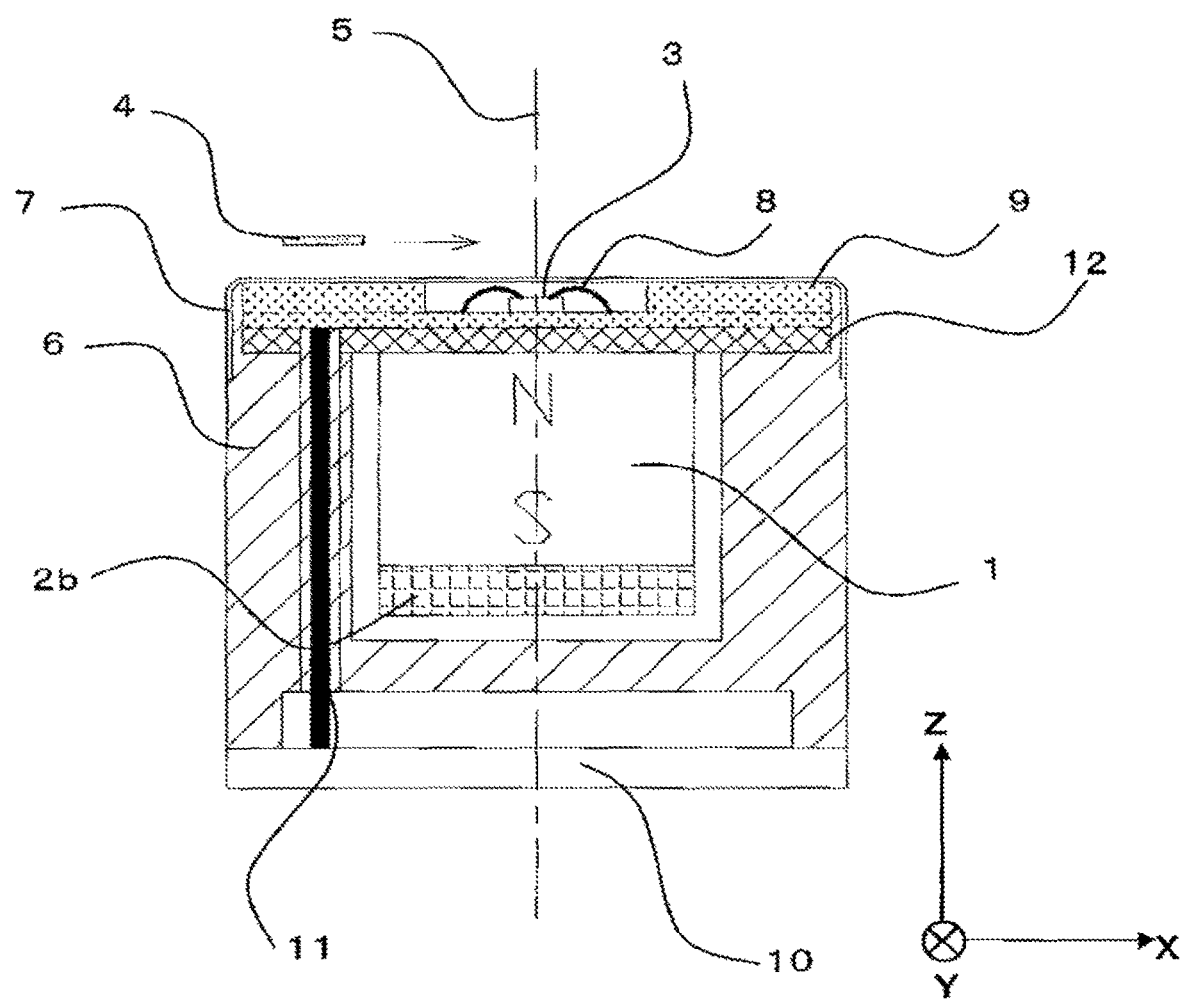

A magnetic sensor device of Embodiment 4 of the present disclosure is described using FIG. 15 and FIG. 16. In FIG. 15 and FIG. 16, constituent elements that are the same or equivalent to those in FIG. 1 are assigned the same reference signs, and description of such constituent elements is omitted. FIG. 15 is a drawing of a cross section, parallel to the conveyance direction of a to-be-detected object 4, of a magnetic sensor device of Embodiment 4 of the present disclosure. In contrast to Embodiment 3 illustrated in FIG. 13, the non-magnetic carrier 12 is arranged between the board 9 and the yoke 2a. The other structure is the same as that of Embodiment 3. This configuration makes possible an increase of strength of the board 9 due to arrangement of the non-magnetic carrier 12 on the backside surface of the board 9, and this configuration also contributes to release of heat from the board 9 and AMR chip 3.

FIG. 16 is a cross-sectional drawing of the configuration of FIG. 15 after removal of the yoke 2a. The non-magnetic carrier 12 is arranged at the upper surface (N-pole side in the figure) of the permanent magnet 1, which is the to-be-detected object 4 side. Due to there being no yoke 2a, the present configuration increases the main magnetic flux (+Bz) and makes possible miniaturization of the permanent magnet 1. Further, although the yoke 2b is arranged with the object of causing an increase in the main magnetic flux (+Bz) of the permanent magnet 1, such arrangement is not necessarily required, and a case without such arrangement is also envisioned.

Embodiment 5

Figure 17:
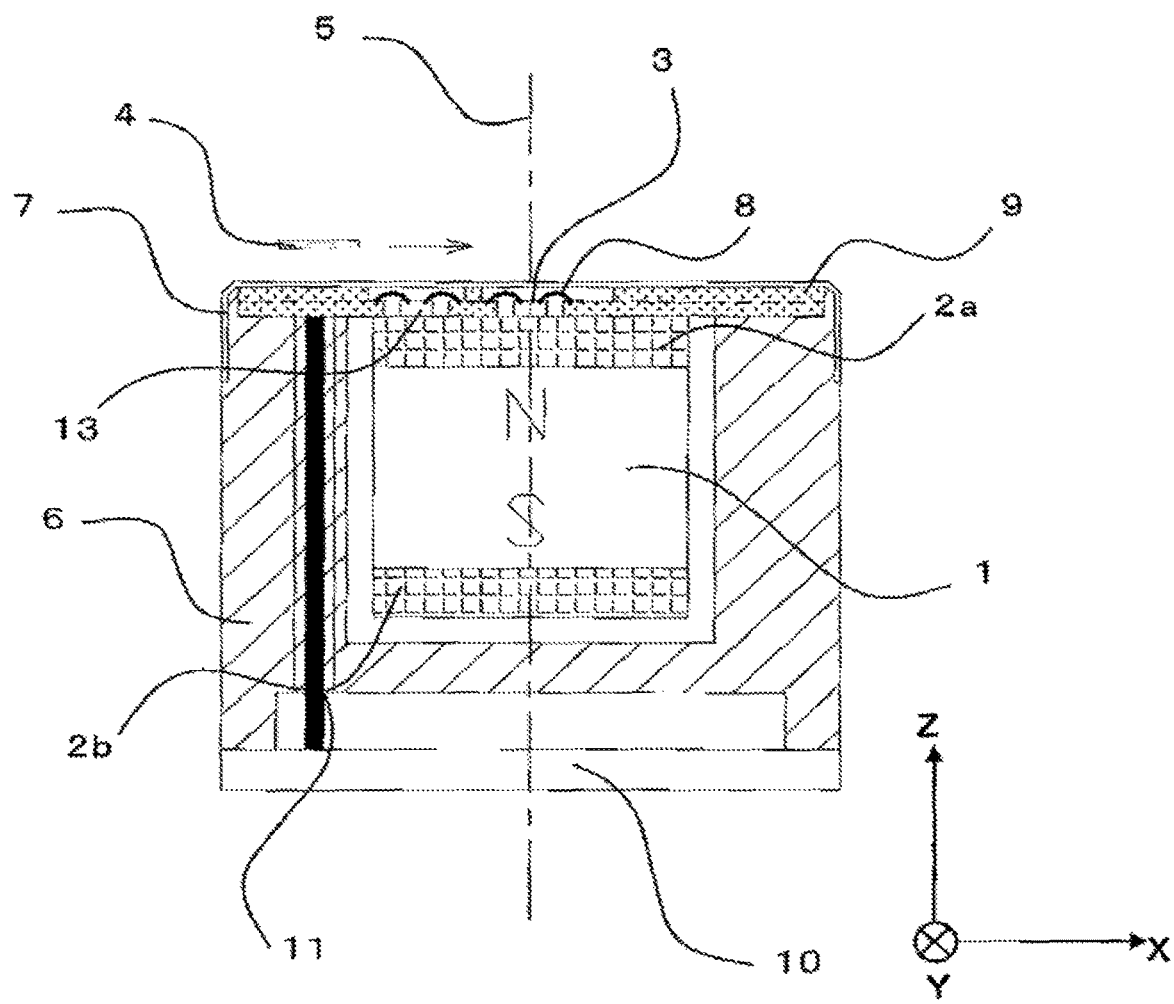
FIG. 17 is a drawing of a cross section, parallel to the conveyance direction of a to-be-detected object, of a magnetic sensor device of Embodiment 5 of the present disclosure.

A magnetic sensor device of Embodiment 5 of the present disclosure is described using FIG. 17. In FIG. 17, constituent elements that are the same or equivalent to those in FIG. 1 are assigned the same reference signs, and description of such constituent elements is omitted. FIG. 17 is a drawing of a cross section, parallel to the conveyance direction of a to-be-detected object 4, of the magnetic sensor device of Embodiment 5 of the present disclosure. In contrast to the Embodiment 1 illustrated in FIG. 1, an AMP-IC 13 is mounted side-by-side with the AMR chip 3 on the upper surface of the yoke 2a, which is the to-be-detected object 4 side. Further, a board 9 is formed from resin such as glass epoxy, surrounds the AMR chip 3 and the AMP-IC 13, and is mounted on the upper surface of the yoke 2a, which is the to-be-detected object 4 side. The other structure is the same as that of Embodiment 1. Although output of the AMR chip 3 is very small, low-noise amplification of the signal can be increased by arrangement of the AMP-IC 13 in the immediate vicinity of the AMR chip 3, and this arrangement contributes to improvement of the signal-to-noise ratio. Further, any of the configurations of Embodiments 1 through 4 can be realized similarly to the present Embodiment 5 by side-by-side mounting of the AMR chip 3 and the AMP-IC 13.

In all the embodiments of the present disclosure, the permanent magnet 1 is described as having the N pole oriented toward the to-be-detected object 4 side, and the S pole oriented toward the side opposite to the to-be-detected object 4 side. However, the operational effects of all the embodiments of the present disclosure are the same also for the configuration in which the permanent magnet 1 has the S pole at the to-be-detected object 4 side, and the N pole oriented toward the side opposite to the to-be-detected object 4 side.

In all the embodiments of the present disclosure, the conveyance direction of the to-be-detected object 4 is described as being the +X-axis direction. However, the operational effects of all the embodiments of the present disclosure are the same also for the configuration in which the conveyance direction of the to-be-detected object 4 is the −X-axis direction.

REFERENCE SIGNS LIST 1 permanent magnet
2a-2b yoke
3 AMR chip (magnetoresistive effect element)
31a-31c AMR chip electrode
32a-32b AMR element (resistive element)
4 to-be-detected object
5 central axis
6 housing
7 metal shield plate
8 metal wiring
9 board
9a recessed hole
9b board
10 signal processing circuit board
10a signal processing circuit
11 cable
12 non-magnetic carrier
13 AMP-IC
91a-91c electrode
92a-92c exterior pad
20 magnetic flux line

The invention claimed is:

1. A magnetic sensor device comprising:
a magnetic field generator, disposed at one surface side of a sheet-like to-be-detected object including a magnetic component, to generate an intersecting magnetic field intersecting the to-be-detected object; and
a magnetoresistive effect element disposed between the to-be-detected object and the magnetic field generator, and having a resistance value that changes in accordance with change of a component of the intersecting magnetic field in a conveyance direction along which the to-be-detected object is conveyed, the change occurring when the to-be-detected object is conveyed in the conveyance direction, wherein
the magnetic field generator is a magnet having a first pole and a second pole in contact and adjacent to each other in a direction normal to the conveyance direction,
the magnetoresistive effect element comprises a first resistive element and a second resistive element adjacent to each other in the conveyance direction and interconnected by a bridge, a conveyance-direction center of a gap between the first resistive element and the second resistive element being disposed at the conveyance-direction center of the magnetic field generator, one end of the first resistive element being connected in common with one end of the second resistive element to form a bridge connection, the first resistive element and the second resistive element being disposed in linear symmetry relative to an axis perpendicular to the conveyance direction and extending through a center of the bridge, a position in the conveyance direction of the center of the bridge of the magnetoresistive effect element coinciding with a position in the conveyance direction of the center of the magnetic field generator, a gap between the first resistive element and the second resistive element increases from the one end of the first resistive element and the second resistive element toward another end of the first resistive element and the second resistive element in a direction perpendicular to the conveyance direction, and a bias magnetic field due to the first and second pole of the magnet is applied in a first direction along the conveyance direction to the first resistive element, and a bias magnetic field due to the first and second pole of the magnet is applied in a second direction along the conveyance direction to the second resistive element, the first direction being opposite to the second direction.

2. The magnetic sensor device according to claim 1, wherein
the magnetic field generator further comprises a yoke disposed at an upper surface side of the magnet and between the magnet and the magnetoresistive effect element, the yoke comprising a soft magnetic body.

3. The magnetic sensor device according to claim 1, further comprising a carrier disposed between the magnetic field generator and the magnetoresistive effect element, the carrier comprising a non-magnetic body.

4. The magnetic sensor device according to claim 1, wherein
the first resistive element and the second resistive element of the magnetoresistive effect element are disposed in an array pattern as two rows having axes oriented in a direction perpendicular to the conveyance direction.

5. The magnetic sensor device according to claim 1, wherein
another end of the first resistive element is connected to a voltage source, and
another end of the second resistive element is grounded, to output voltage change of the bridge connection between the one end of the first resistive element and the one end of the second resistive element.

* * * * *